(12) United States Patent
Yamashita et al.

(10) Patent No.: US 11,569,283 B2
(45) Date of Patent: Jan. 31, 2023

(54) IMAGE PICKUP APPARATUS HAVING IMAGE SENSOR EQUIPPED WITH POLARIZING ELEMENT AND CONTROL METHOD THEREFOR

(71) Applicant: CANON KABUSHIKI KAISHA, Tokyo (JP)

(72) Inventors: Yusuke Yamashita, Kanagawa (JP); Tokuro Nishida, Kanagawa (JP); Kazuya Kitamura, Kanagawa (JP); Hiroyuki Hasegawa, Chiba (JP); Takenori Kobuse, Kanagawa (JP); Yoshikazu Ishikawa, Kanagawa (JP); Takayuki Kimura, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 13 days.

(21) Appl. No.: 17/176,631

(22) Filed: Feb. 16, 2021

(65) Prior Publication Data

US 2021/0280618 A1  Sep. 9, 2021

(30) Foreign Application Priority Data

Mar. 5, 2020  (JP) .............................. JP2020-037917

(51) Int. Cl.
| | |
|---|---|
| *H04N 5/225* | (2006.01) |
| *H01L 27/146* | (2006.01) |
| *H04N 5/232* | (2006.01) |

(52) U.S. Cl.
CPC .... *H01L 27/1462* (2013.01); *H01L 27/14609* (2013.01); *H01L 27/14625* (2013.01);
(Continued)

(58) Field of Classification Search
None
See application file for complete search history.

(56) References Cited

U.S. PATENT DOCUMENTS

| | | |
|---|---|---|
| 10,411,048 B2 | 9/2019 | Okuno |
| 2017/0006277 A1* | 1/2017 | D'Amico ............... H04N 5/265 |

(Continued)

FOREIGN PATENT DOCUMENTS

JP  2018007024 A  1/2018

*Primary Examiner* — Twyler L Haskins
*Assistant Examiner* — Wesley J Chiu
(74) *Attorney, Agent, or Firm* — Rossi, Kimms & McDowell LLP

(57) ABSTRACT

An image pickup apparatus that enables to quickly capture an image from which a predetermined reflected light component is removed with desired sensitivity. A polarizing filter two-dimensionally arranges a plurality of sets each of which includes polarizing filter elements having different polarization directions. A first image sensor has pixels that respectively correspond to polarizing filter elements of the polarizing filter. A polarization calculation unit detects a polarized component of light that enters into a region in which one set of polarizing filter elements are arranged based on signals output from pixels in the region of the first image sensor for each region. A correction unit corrects a pixel signal output from a pixel of a second image sensor corresponding to the region based on a calculation result by the polarization calculation unit for each pixel of the second image sensor.

9 Claims, 8 Drawing Sheets

(52) U.S. Cl.
CPC ......... *H04N 5/2254* (2013.01); *H04N 5/2258* (2013.01); *H04N 5/23229* (2013.01)

(56) References Cited

U.S. PATENT DOCUMENTS

| | | | |
|---|---|---|---|
| 2018/0204882 A1* | 7/2018 | Segawa | H01L 31/10 |
| 2018/0213170 A1* | 7/2018 | Segawa | H04N 9/04557 |
| 2020/0106939 A1* | 4/2020 | Yang | G02F 1/133528 |
| 2020/0112666 A1* | 4/2020 | Fujimoto | H04N 5/243 |
| 2020/0183066 A1* | 6/2020 | Mitani | G03B 15/00 |
| 2020/0195818 A1* | 6/2020 | Li | H04N 5/2258 |

* cited by examiner

IMAGE PICKUP APPARATUS HAVING IMAGE SENSOR EQUIPPED WITH POLARIZING ELEMENT AND CONTROL METHOD THEREFOR

BACKGROUND OF THE INVENTION

Field of the Invention

The present invention relates to an image pickup apparatus having an image sensor equipped with a polarizing element that is capable of obtaining polarization information in different directions and relates to a control method therefor.

Description of the Related Art

An image sensor represented by a CCD sensor, CMOS sensor, or the like has a plurality of light-receiving elements (pixels) that are arranged two-dimensionally and is able to detect light intensities (luminance values) because the pixels convert light into electrical signals. Moreover, when color filters that allow to pass wavelength bands of red (R), green (G), and blue (B) are arranged to the respective pixels, only light in a visible wavelength band can be obtained. Such a mechanism enables to convert a color image that is visible to a person into a digital signal, to save the digital signal in a storage device, and to display the image on a display device.

Light has a property called polarization other than properties, such as luminance and color. Polarization can be considered as an oscillation component of light. It is known that light emitted from a light source and reflected by an object has oscillation components of various directions (polarization directions). A human hardly feels polarization because polarized light and non-polarized light (scattered light) are combined and reach human eyes, actually.

In the meantime, a necessary image can be emphasized by selecting polarized light positively to remove an unnecessary image. For example, a photographing technique that removes an image projected in a water surface or a glass surface using a polarizing filter (hereinafter referred to as a "PL filter") is widely used. Besides this, polarization is applied to a purpose to emphasize contrast by reducing unnecessary reflected light and a purpose to visualize stress applied to a physical solid based on polarization intensity.

For example, as a technique of using a polarization component positively, Japanese Laid-Open Patent Publication (Kokai) No. 2018-7024 (JP 2018-7024A) suggests a method that sets an exposure condition on the basis of a plurality of images that are captured while rotating a PL filter.

However, the technique disclosed in the above-mentioned publication needs a predetermined time, which enlarges possibility of missing a timing of capturing a desired image.

SUMMARY OF THE INVENTION

The present invention provides an image pickup apparatus that enables to quickly capture an image from which a predetermined reflected light component is removed with desired sensitivity.

Accordingly, a first aspect of the present invention provides an image pickup apparatus including a polarizing filter configured to two-dimensionally arrange a plurality of sets each of which includes polarizing filter elements having different polarization directions, a first image sensor configured to have pixels that respectively correspond to polarizing filter elements of the polarizing filter, a second image sensor, a polarization calculation unit configured to detect a polarized component of light that enters into a region in which one set of polarizing filter elements are arranged based on signals output from pixels in the region of the first image sensor for each region, and a correction unit configured to correct a pixel signal output from a pixel of the second image sensor corresponding to the region based on a calculation result by the polarization calculation unit for each pixel of the second image sensor.

Accordingly, a second aspect of the present invention provides a control method for an image pickup apparatus including a polarizing filter that two-dimensionally arranges a plurality of sets each of which includes polarizing filter elements having different polarization directions, a first image sensor that has pixels that respectively correspond to polarizing filter elements of the polarizing filter, and a second image sensor, the control method including detecting a polarized component of light that enters into a region in which one set of polarizing filter elements are arranged based on signals output from pixels in the region of the first image sensor for each region, determining whether the polarized component is larger than a predetermined threshold, correcting a pixel signal of a pixel of the second image sensor corresponding to the region based on signals output from pixels in the region of the first image sensor in a case where the polarized component is larger than the predetermined threshold, and generating a pickup image using pixel signals of the second image sensor corresponding to regions where polarized components are not larger than the predetermined threshold and signals that are corrected.

According to the present invention, an image from which a predetermined reflected light component is removed can be quickly captured with desired sensitivity.

Further features of the present invention will become apparent from the following description of exemplary embodiments with reference to the attached drawings.

DESCRIPTION OF THE EMBODIMENTS

Figure 1:
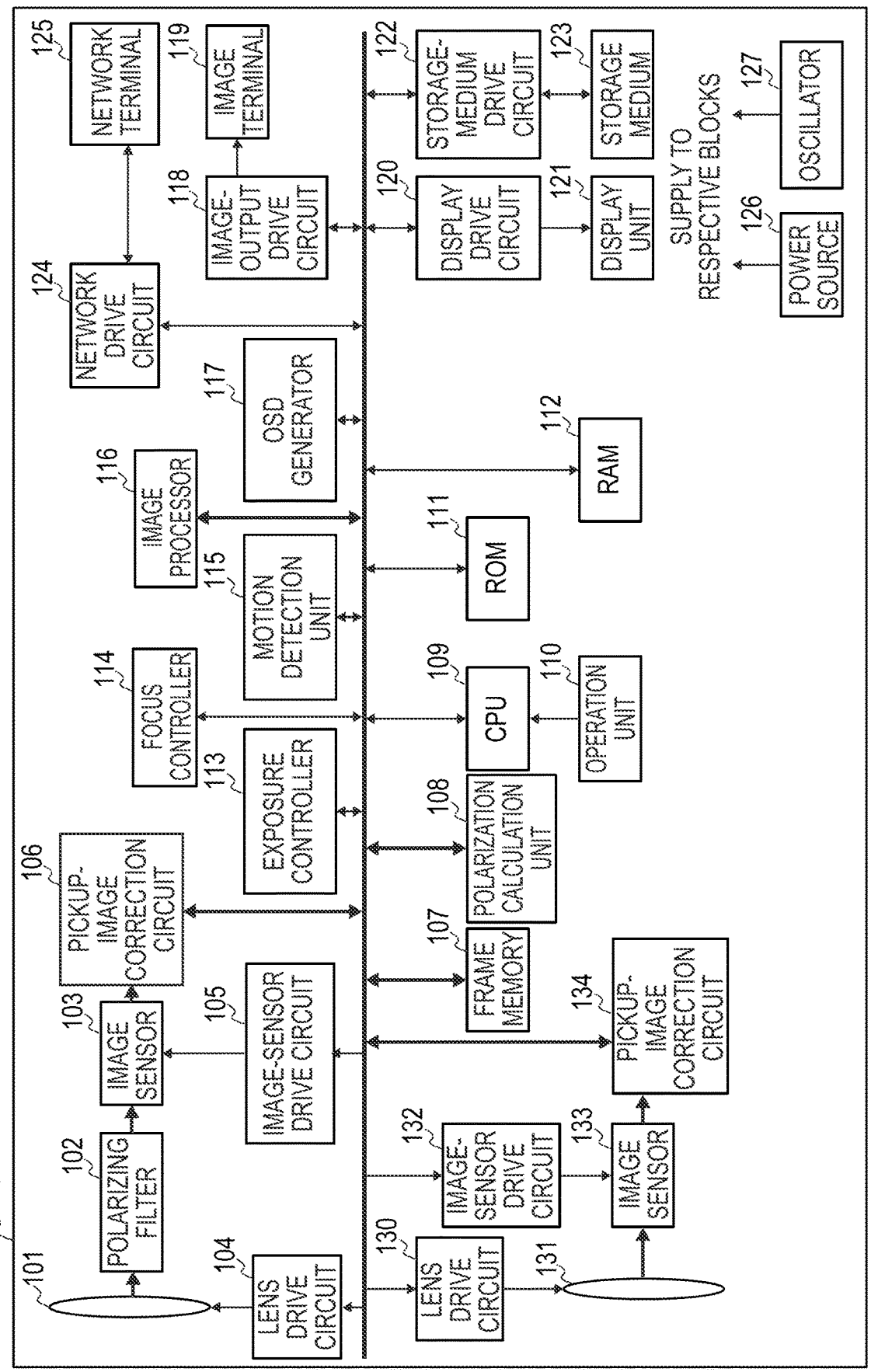
FIG. 1 is a block diagram showing a schematic configuration of an image pickup apparatus concerning an embodiment of the present invention.

Hereafter, embodiments according to the present invention will be described in detail by referring to the drawings.

FIG. 1 is a block diagram showing a schematic configuration of an image pickup apparatus 100 according to an embodiment of the present invention. The image pickup apparatus 100 is configured to input, output, store, and display an image.

An image sensor in this embodiment will be described first. When an image sensor like a CMOS sensor is provided with a polarizing filter element for every pixel (photoelectric conversion element), and when one composite pixel is constituted by four photoelectric conversion elements to which four polarizing filter elements are applied in order to obtain polarization properties in four directions, a resolution is lowered to one fourth as compared with an image sensor of the same cell size that has no polarizing filter. Moreover, since the polarizing filter is provided in front of an image pickup surface, an incident light amount will be lowered as compared with a case where no polarizing filters are provided. If degradation of the incident light amount will be compensated by raising sensitivity of the image sensor, a problem of increasing noise will occur. Accordingly, the image pickup apparatus 100 concerning this embodiment secures an information amount of polarization information without lowering a resolution of a picked-up image by providing a first image sensor with a polarizing filter and a second image sensor without a polarizing filter. Regions of the first image sensor corresponds to regions of the second image sensor.

The image pickup apparatus 100 is provided with optical lenses 101 and 131, a polarizing filter 102, lens drive circuits 104 and 130, the first and second image sensors 103 and 133, image-sensor drive circuits 105 and 132, pickup-image correction circuits 106 and 134, and a frame memory 107. Moreover, the image pickup apparatus 100 is provided with a polarization calculation unit 108, an exposure controller 113, a focus controller 114, a motion detection unit 115, an image processor 116, an OSD generator 117, a CPU 109, a ROM 111, a RAM 112, and an operation unit 110. Furthermore, the image pickup apparatus 100 has a display unit 121, a display drive circuit 120, an image terminal 119, an image-output drive circuit 118, a network terminal 125, a network drive circuit 124, a storage medium 123, a storage-medium drive circuit 122, a power source 126, and an oscillator 127.

The optical lenses 101 and 131 respectively constitute a first image pickup optical system and a second image pickup optical system. The lens drive circuits 104 and 130 respectively move the optical lenses 101 and 131 in optical axis directions for zooming and focusing. It should be noted that an image formed by the optical lens 101 shall be identical to an image formed by the optical lens 131 in this embodiment. Incident light passing through the optical lens 101 is received by the first image sensor 103 through the polarizing filter 102. Incident light passing through the optical lens 131 is received by the second image sensor 133. It should be noted that the polarizing filter 102 and the first image sensor 103 constitute an image-pickup-surface polarization sensor 200 mentioned later by referring to FIG. 2.

Each of the first and second image sensors 103 and 133 is a CCD sensor, a CMOS sensor, or the like that converts an optical image formed on an image pickup surface into an analog electric signal. The first and second image sensors 103 and 133 have a function to convert the generated analog electric signal into a digital signal. Although the first and second image sensors 103 and 133 shall be large-size devices that can capture a high quality image called 4K and 8K, they are not restricted to such devices.

The image-sensor drive circuits 105 and 132 respectively drive the first and second image sensors 103 and 133. The pickup-image correction circuits 106 and 134 respectively apply various correction processes to the images converted into the digital signals by the first and second image sensors 103 and 133. For example, each of the pickup-image correction circuits 106 and 134 corrects variation of performances of pixels, corrects a white balance, and corrects distortion and deficiency in marginal illumination due to properties of the optical lenses 101 and 131.

The frame memory 107 is a general RAM that temporarily stores an image signal (image data) so as to be read if necessary. Since data volume of an image signal is huge, the frame memory 107 should have large capacity and enable high-speed writing and high-speed reading. For example, when a DDR3-SDRAM is employed as the frame memory 107, various processes, such as composition of images of different timings and segmentation (trimming) of a required area, are available.

The polarization calculation unit 108 detects a polarized component for every four pixels (four photoelectric conversion elements) of the first image sensor 103 on the basis of signals output from the first image sensor 103 and generates polarization information. The polarization information means luminance information obtained in a plurality of polarization angles and luminance information in an arbitrary polarization angle that can be found from the obtained luminance information as mentioned later. The exposure controller 113 controls exposure. The focus controller 114 controls focus positions of the first image pickup optical system and second image pickup optical system. The motion detection unit 115 detects a motion of an object. The image processor 116 processes an image (image data). Moreover, the image processor 116 aligns images output from the first and second image sensors 103 and 133 and applies reflection removing correction to the image output from the first image sensor 103. The OSD generator 117 superimposes an OSD, such as character data, on an image.

The CPU 109 integrally controls functions of the image pickup apparatus 100. The ROM 111 is a nonvolatile storage medium and stores a program that the CPU 109 runs, various adjust parameters, etc. The program read from the ROM 111 is developed to the RAM 112, which is a volatile storage medium, and is executed. Generally, a speed and capacity of the RAM 112 are lower than that of the frame memory 107.

The operation unit 110 functions as an interface to an operation from the outside and receives a user operation. The operation unit 110 includes mechanical buttons and switches, such as a power switch and a mode change switch, and transmits an instruction allocated to a member that is operated by the user to the CPU 109. The display unit 121 displays an image processed by the image processor 116 or the OSD generation unit 117, a setting menu, etc. The user is able to check an operation situation of the image pickup apparatus 100 by visually recognizing displayed contents on the display unit 121. The display drive circuit 120 controls display on the display unit 121. Although the display unit 121a uses a liquid crystal display panel or an organic electroluminescence display panel, the display panel is not limited to them. Moreover, a touch panel may be provided in the display unit 121. The touch panel functions as the operation unit 110.

The image terminal 119 is an interface for transmitting an image signal (image data) to an external device and enables to display the image on the external device. Typical standards of the image terminal 119 are SDI, HDMI (registered trademark), DisplayPort, etc. The image-output drive circuit 118 controls the image terminal 119 according to the standard of the image terminal 119. The network terminal 125 is an interface that is able to transmit not only an image signal but also various control signals. The network drive circuit 124 controls the network terminal 125 to enable connection with a network like the Internet.

The storage medium 123 is a large-capacity memory unit, such as an HDD and an SSD, and stores image data and various setting data. The storage-medium drive circuit 122 controls writing/reading of various data to the storage medium 123. The power source 126 converts voltage of electric power supplied from a commercial power source or a battery into arbitrary voltage and distributes. The power source 126 supplies electric power to blocks constituting the image pickup apparatus 100. The oscillator 127 has an oscillation element called a crystal. The CPU 109 generates a desired timing signal on the basis of the single periodic signal input from the oscillation element and proceeds with a program sequence.

Next, the polarizing filter 102 and the first image sensor 103 will be described. The polarizing filter 102 is arranged at the front side (object side) of the image pickup surface of the first image sensor 103. The image sensor having such a configuration is referred to as the "image-pickup-surface polarization sensor" in the following description.

Figure 2:
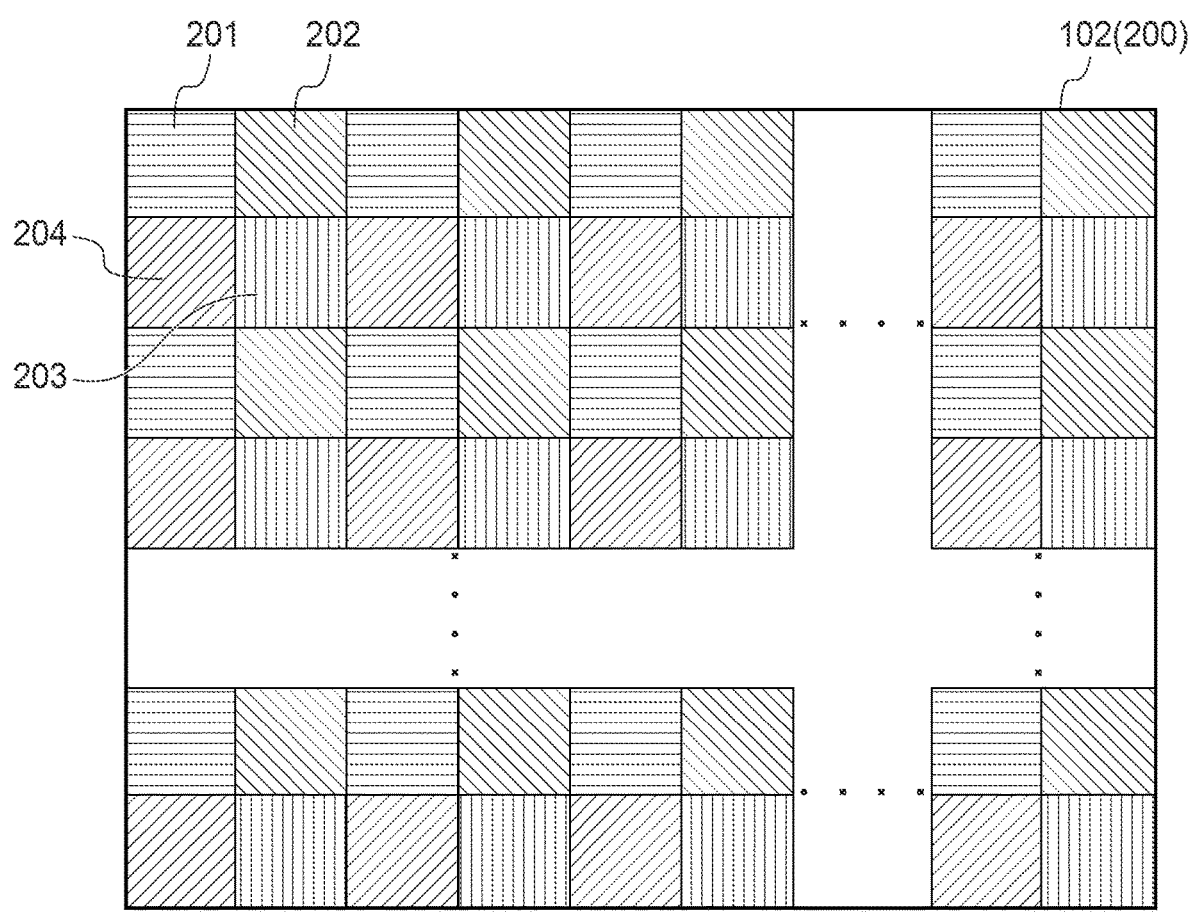
FIG. 2 is a view showing an arrangement example of polarizing filter elements in the image pickup apparatus of FIG. 1.

FIG. 2 is a view showing an arrangement example of polarizing filter elements of the polarizing filter 102 in the image-pickup-surface polarization sensor 200. The polarizing filter 102 has polarizing filter elements 201, 202, 203, and 204. One filter element is arranged for one pixel of the first image sensor 103. The four polarizing filter elements 201 through 204 constitute one set, and such sets are repeatedly arranged two-dimensionally in directions that mutually intersect perpendicularly. Polarization directions of the polarizing filter elements 201 through 204 are mutually different, and the lights of the different polarization directions are detected. Specifically, the polarization directions of the polarizing filter elements 201, 202, 203, and 204 are respectively equal to 0 degrees, 45 degrees, 90 degrees, and 135 degrees that are shifted by every 45 degrees.

Thereby, the lights of the four different polarization directions are always obtained at the same timing as images of the same frame without manually rotating a PL filter arranged in front of a lens. For example, when pixel signals are taken out from only pixels corresponding to polarizing filter elements of one certain polarization direction, an image that has a polarization property of the corresponding polarizing filter elements is obtained. The image-pickup-surface polarization sensor 200 of FIG. 2 enables to obtain images that have properties of the four different polarization directions.

Figure 3:
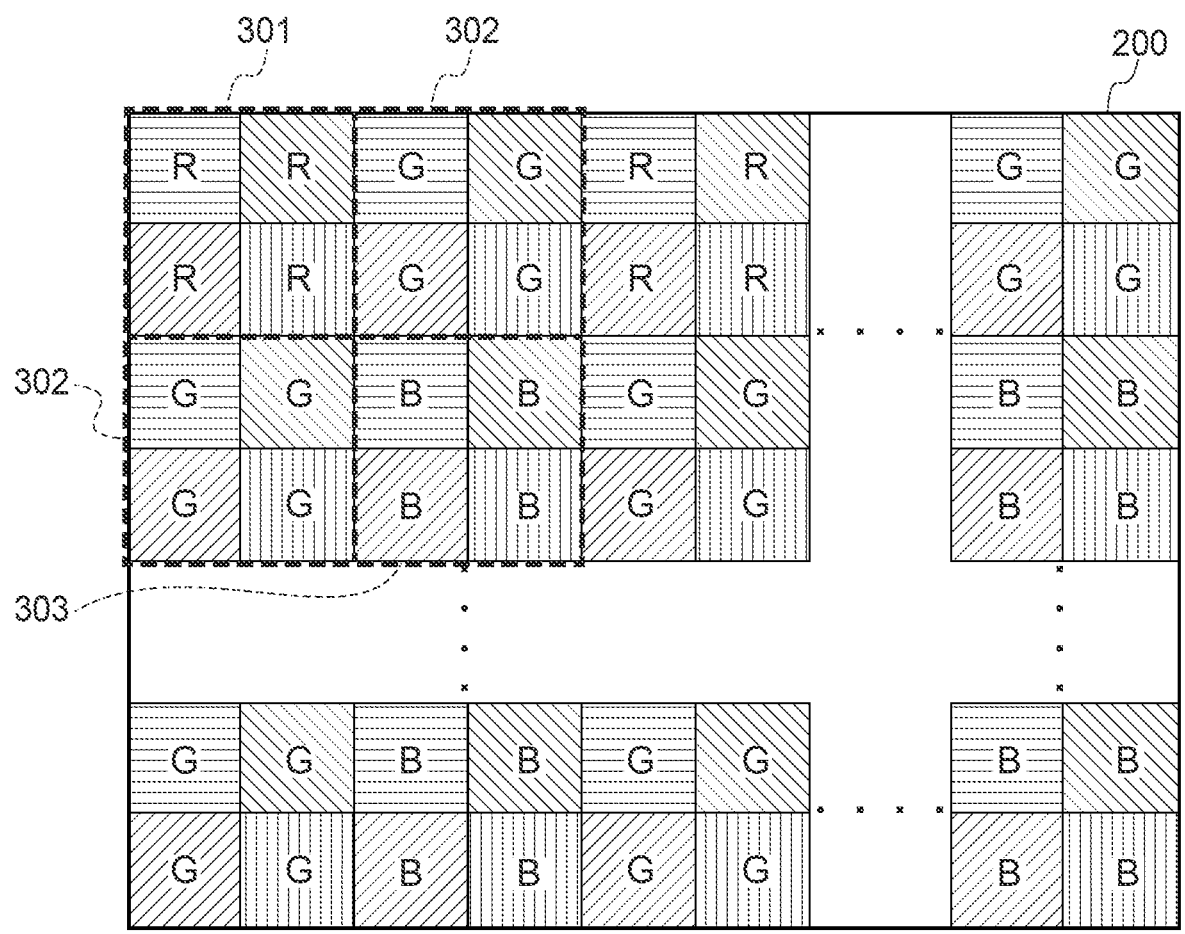
FIG. 3 is a view showing an arrangement example of color filter elements in an image sensor of the image pickup apparatus of FIG. 1.

Since a color filter is not considered in FIG. 2, a monochrome image will be obtained. When the first image sensor 103 is provided with a color filter, a color image will be obtained. FIG. 3 is a view showing an arrangement example of color filter elements of a color filter in the image-pickup-surface polarization sensor 200. In the image-pickup-surface polarization sensor 200, a color filter element of one color is arranged in a region corresponding to one set of the polarizing filter elements 201 through 204. The color filter is configured by arranging red (R) filter elements 301, green (G) filter elements 302, and blue (B) filter element 303 in the Bayer arrangement.

It should be noted that the configuration of the image-pickup-surface polarization sensor 200 shown in FIG. 2 and FIG. 3 is an example and is not limited to this. The arrangement method and polarization directions of the polarizing filter elements can be set up arbitrarily. Moreover, a region where a polarizing filter element is arranged and a region where a polarizing filter element is not arranged may be arranged in combination on a pixel of the first image sensor 103.

Next, a calculation method for generating luminance information in an arbitrary polarization angle from luminance information (polarization information) obtained in a plurality of polarization angles will be described. This calculation is performed by the polarization calculation unit 108 under control of the CPU 109.

Figure 4A:
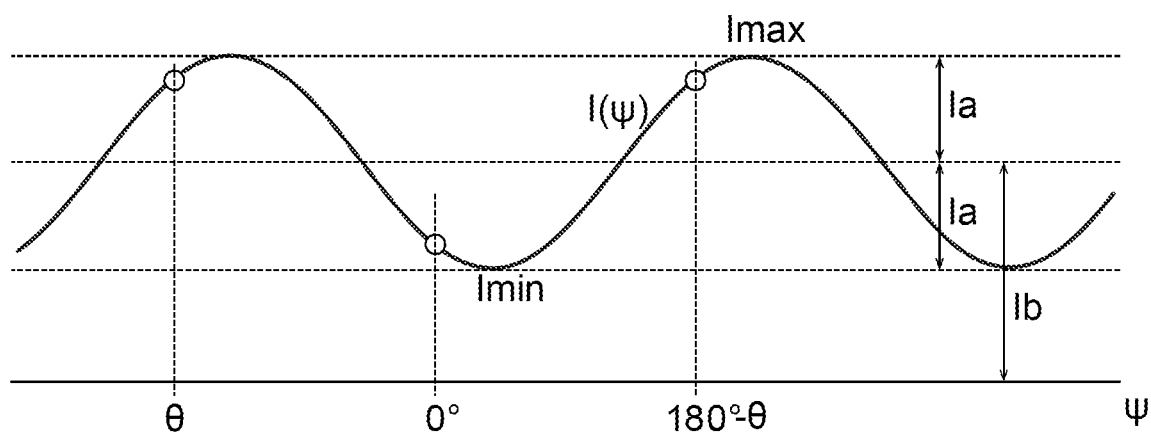
FIG. 4A and FIG. 4B are graphs describing a waveform and polarization component of light that reaches a human eye.

FIG. 4A is a graph describing a waveform of light that reaches a human eye. Light that reaches a human eye is in a state where a polarized component and a non-polarized component (scattered light) are composited and is observed as a waveform of characteristic shown in FIG. 4A, for example. In FIG. 4A, Imax is a composited value of the polarized component and non-polarized component. Imin is a value of only the non-polarized component except the polarized component, and Ib is an output level in a case where the phase of the polarized component is 0 degrees. A value Ia is a half of difference between Imax and Imin, i.e., it is an amplitude value of the light. The luminance I of the waveform in FIG. 4A is represented by the following equation (1) as a general equation. A circularly polarized component shall be a non-polarized component.

Figure 4B:
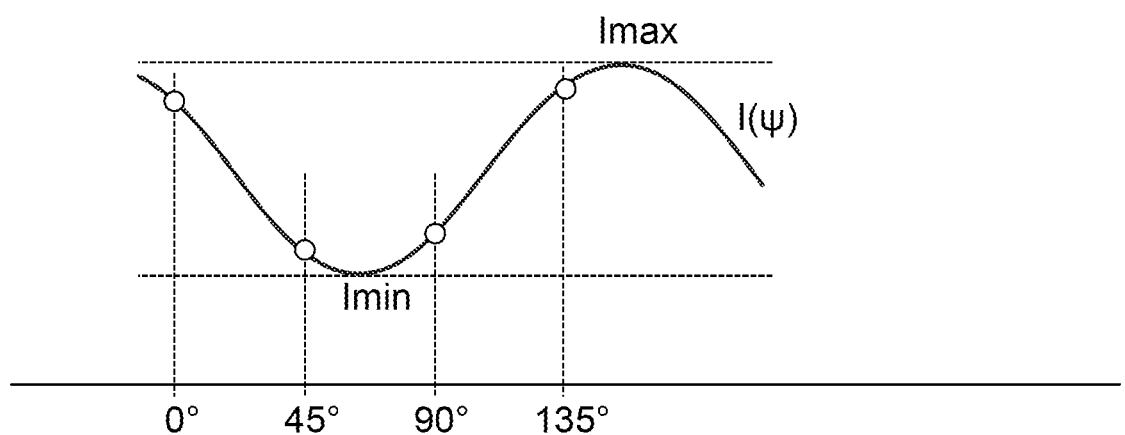

FIG. 4B is a graph showing a waveform of light that is found from the luminance value actually measured in the predetermined polarization angle. When 0 degrees, 45 degrees, 90 degrees, and 135 degrees are assigned to the polarization angle $\psi$ in the equation (1), the following equations (2) through (5) are obtained. When the actual measured values of the luminance I are assigned to at least three equations among these five equations, Ia, Ib, and $\theta$ are found, which enables calculation of the luminance I in an arbitrary polarization angle using the equation (1). Moreover, a ratio of Imax and Imin can be found as a polarization degree DoLP (Degree of Linear Polarization) using the following equation (6). In addition, a polarization angle AoLP (Angle of Linear Polarization) can be found by solving the equations by the coefficient $\theta$. In this way, the luminance in an arbitrary polarization angle can be calculated from the actual measured values using the following equation 1, and the result can be used for the image process, such as reduction and emphasis of the reflection component.

[Formula 1]

$$I(\psi) = Ib + Ia \cdot \cos(2\theta + 2\psi) \quad (1)$$

$$I(0) = Ib + Ia \cdot \cos(2\theta) \quad (2)$$

$$I(45) = Ib + Ia \cdot \cos(2\theta + 90) \quad (3)$$

$$I(90) = Ib + Ia \cdot \cos(2\theta + 180) \quad (4)$$

$$I(135) = Ib + Ia \cdot \cos(2\theta + 270) \quad (5)$$

$$DoLP = \frac{(I\max - I\min)}{(I\max + I\min)} \quad (6)$$

Figure 5A:
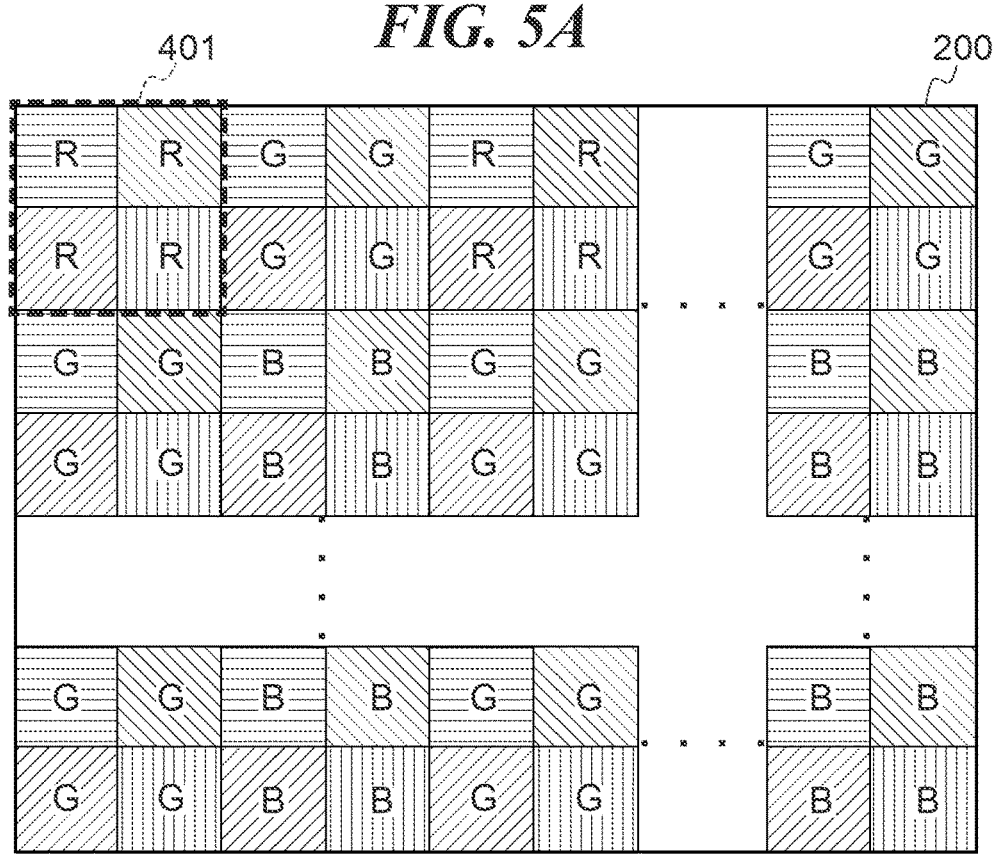
FIG. 5A and FIG. 5B are views describing pixel arrangement examples of two image sensors of the image pickup apparatus of FIG. 1.
Figure 5B:
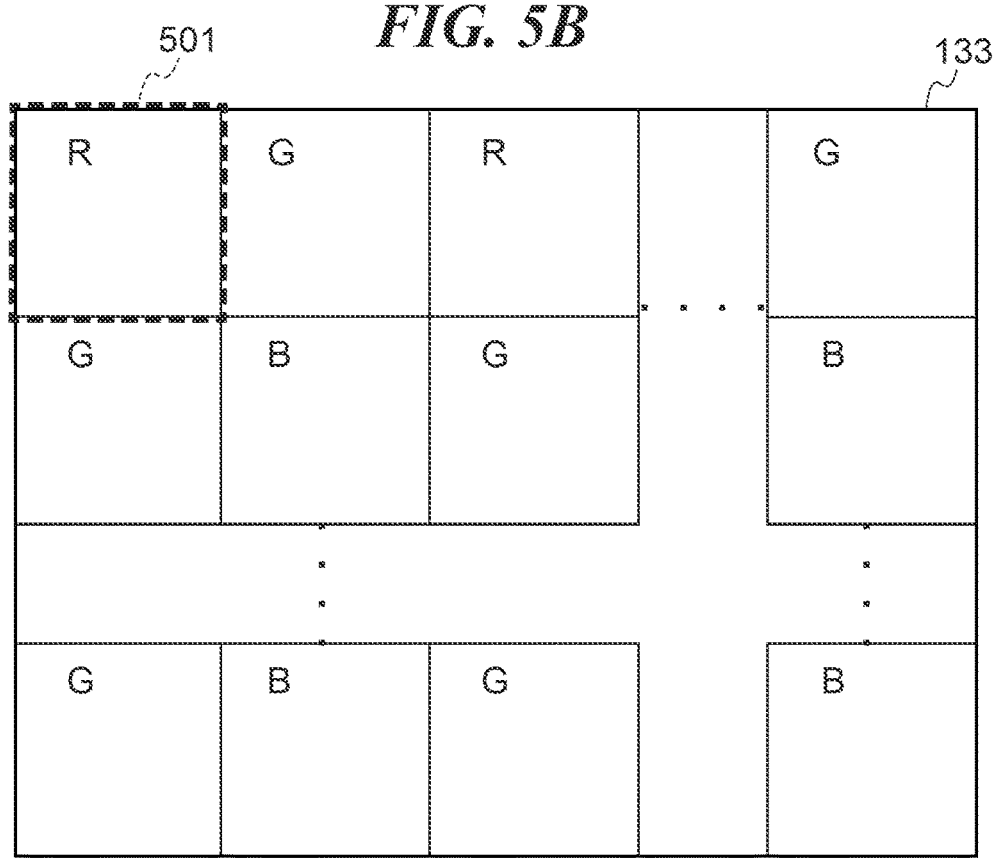

FIG. 5A is a view showing the pixel arrangement of the image-pickup-surface polarization sensor 200. Although FIG. 5A is basically identical to FIG. 3, it is appeared again for comparison with FIG. 5B. FIG. 5B is a view showing a pixel arrangement of the second image sensor 133. In the second image sensor 133, a color filter element of one color is arranged on one pixel 501. The arrangement configuration of color filter elements of the second image sensor 133 is the same as that of the image-pickup-surface polarization sensor 200. That is, the pixel size of the second image sensor 133 is equal to the pixel size formed by the four photoelectric conversion elements corresponding to one set of the polarizing filter elements 201 through 204 in the first image sensor 103. Specifically, the number of pixels of the image-pickup-surface polarization sensor 200 is the quadruple of the number of pixels of the second image sensor 133. An area of a pixel 501 of the second image sensor 133 is the quadruple of the area of a pixel of the image-pickup-surface polarization sensor 200.

Figure 6A:
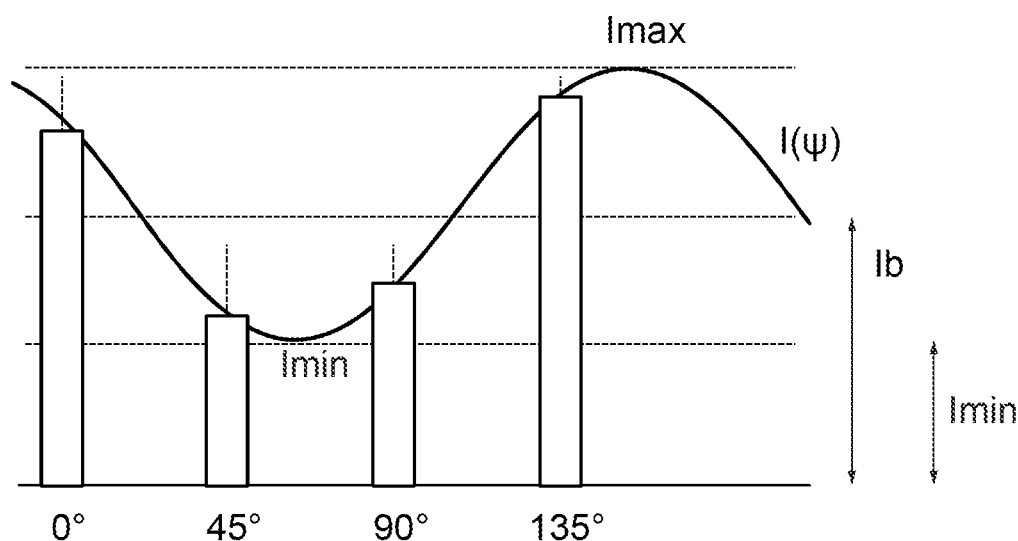
FIG. 6A and FIG. 6B are graphs showing output levels of pixel signals output from the image sensors of FIG. 5A and FIG. 5B.
Figure 6B:
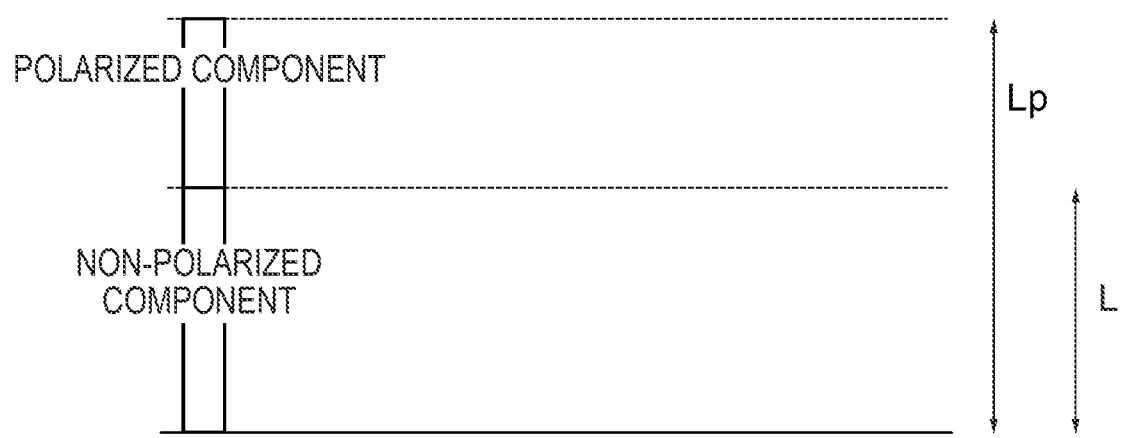

Next, a method for removing the reflection component in a signal of the pixel 501 of the second image sensor 133 using the pixel signals of one set of the pixels 401 of the first image sensor 103 will be described. FIG. 6A is a graph showing the output levels (luminance values) of the pixel signals output from one set of the pixels 401. FIG. 6B is a graph showing the output level of the pixel signal output from the pixel 501.

As described by referring to FIG. 4A, the polarized components of the incident light can be calculated from the pixel signals output from the pixels of the color filter elements of the same color of the image-pickup-surface polarization sensor 200. As a result, the relationship between the polarization angle and output level as shown by the waveform in FIG. 6A is obtained. In the same manner as FIG. 4A, Imin is the output level of only the non-polarized component and Ib is the output level of the case where the phase of the polarized component is zero.

In the meantime, since the second image sensor 133 is not provided with the polarizing filter, the output level Lp of the pixel signal from the pixel 501 becomes the sum of the polarized component and non-polarized component as shown in FIG. 6B. When the output level of only the non-polarized component shall be L, the ratio of L to Lp becomes equal to the ratio of Imin to Ib that are calculated from the output of the image-pickup-surface polarization sensor 200 because the second image sensor 133 and image-pickup-surface polarization sensor 200 capture the same object. That is, as shown by the following equation (7), while using Imin and Ib that are calculated from the output levels of the image-pickup-surface polarization sensor 200, the value obtained by dividing Imin by Ib is multiplied by the output level Lp of the second image sensor 133. Thereby, the output level L of the non-polarized component of the second image sensor 133 is found.

[Formula 2]

$$L = Lp \cdot \frac{Imin}{Ib} \quad (7)$$

Figure 7:
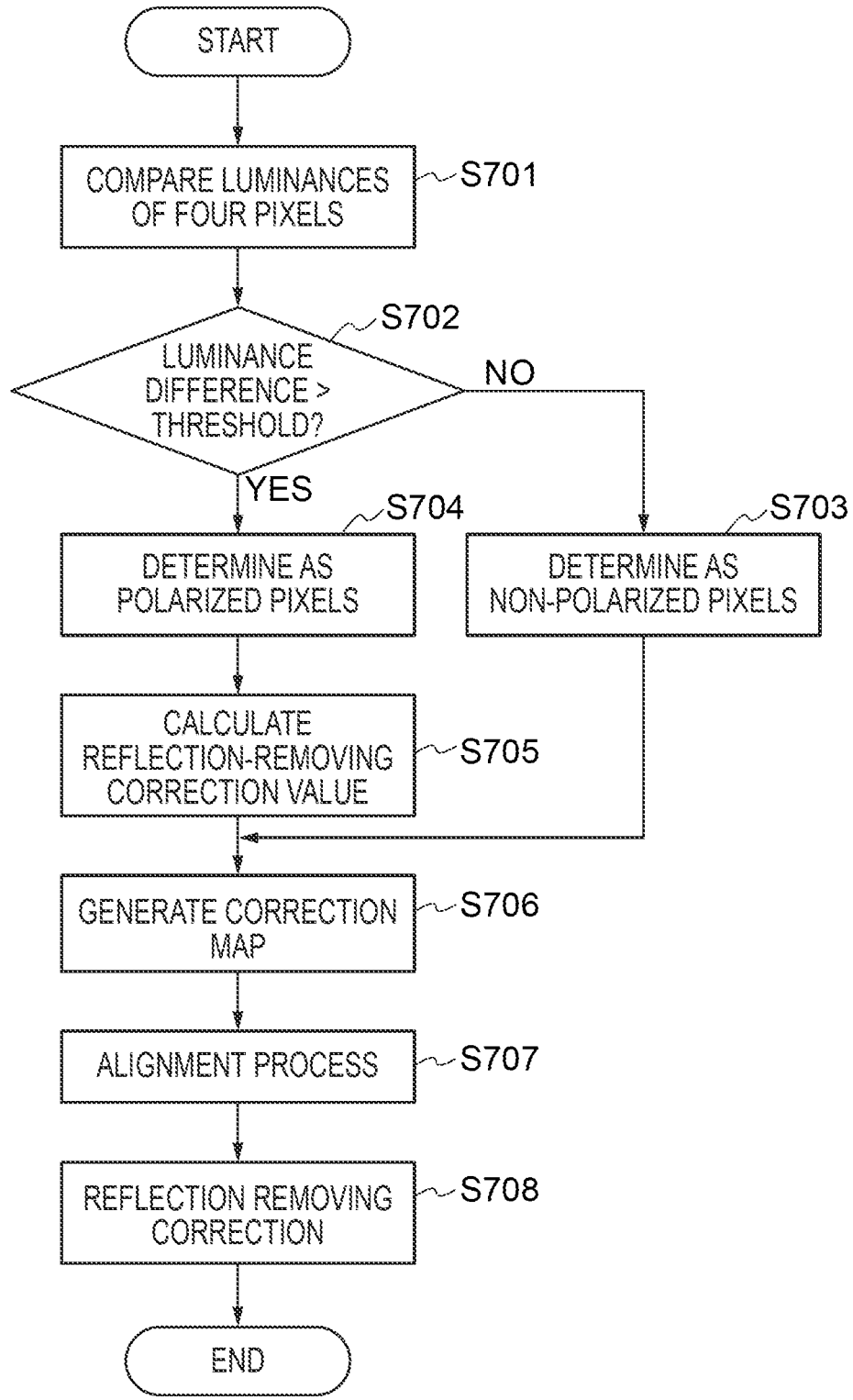
FIG. 7 is a flowchart showing a first image pickup control process of the image pickup apparatus of FIG. 1.

FIG. 7 is a flowchart showing a first image pickup control process of the image pickup apparatus 100. Each process indicated by an S-number in FIG. 7 is achieved, when the CPU 109 develops a predetermined program stored in the ROM 111 to the RAM 112 and integrally controls operations of parts of the image pickup apparatus 100.

The CPU 109 treats four pixels of the image-pickup-surface polarization sensor 200 corresponding to the polarizing filter elements 201 through 204 as one set corresponding to one color filter element. In S701, the CPU 109 compares output levels of a set of pixels for each set and finds luminance difference. In S702, the CPU 109 determines whether the luminance difference obtained in S701 is larger than a predetermined threshold. When determining that the luminance difference is not larger than the predetermined threshold (NO in S702) the CPU 109 proceeds with the process to S703. When determining that the luminance difference is larger than the predetermined threshold (YES in S702), the CPU 109 proceeds with the process to S704.

In S703, the CPU 109 determines that the set of pixels of which the luminance difference is not larger than the predetermined threshold are non-polarized pixels and proceeds with the process to S706 after that. In S704, the CPU 109 determines that the set of pixels of which the luminance difference is larger than the predetermined threshold are polarized pixels. Then, the CPU 109 calculates a reflection-removing correction value for every polarized pixel in S705. In a correction-value calculation process, the above mentioned ratio of Imin to Ib is calculated as the reflection-removing correction value.

In S706, the CPU 109 generates a correction map for removing reflection of an image output from the second image sensor 133 from the correction data calculated in S705. In S707, the CPU 109 performs an alignment process by the image processor 116. Since the images formed on the image-pickup-surface polarization sensor 200 and image sensor 133 through the respectively different optical systems, minute deviation may occur between the mutual object images. The alignment process corrects pixel signals obtained from at least one of the image-pickup-surface polarization sensor 200 and image sensor 133 so as to eliminate this deviation. The process in S707 is a function of an alignment unit. In S708, the CPU 109 controls the image processor 116 to generate a pickup image by applying reflection removing correction to image signals output from the second image sensor 133 using the correction map generated in S706 while considering the result of the alignment process in S707 and finishes this process. The processes in S706 and S708 are functions of a correction unit that corrects a signal output from the second image sensor 133 on the basis of a calculation result by the polarization calculation unit 108.

The image pickup control mentioned above enables to obtain the image from which undesired reflection light is removed using the signal obtained by the second image sensor 133 that is not provided with the polarizing filter 102 as a base. Accordingly, an image can be picked up promptly without missing a timing for obtaining a desired image because it is not necessary to rotate a PL filter in front of the lens. Moreover, since the second image sensor 133 is not provided with a polarizing filter, degradation of the incident light amount due to a polarizing filter does not occur. Accordingly, an image can be picked up while setting the second image sensor 133 to a desired sensitivity.

The sensitivity of the first image sensor 103 (image-pickup-surface polarization sensor 200) equipped with the polarizing filter 102 is smaller than the sensitivity of the second image sensor 133 that is not provided with a polarizing filter because of influence of the polarizing filter 102. Accordingly, even if a pixel signal of the image sensor is not saturated, a pixel signal of the second image sensor 133 may be saturated. When the pixel signal is saturated, the first image pickup control process may not remove reflection appropriately. Accordingly, a second image pickup control process replaces a pixel signal of the second image sensor 133 with a corresponding pixel signal of the image-pickup-surface polarization sensor 200 when the pixel signal of the second image sensor 133 that is not provided with the polarizing filter 102 is saturated.

Figure 8:
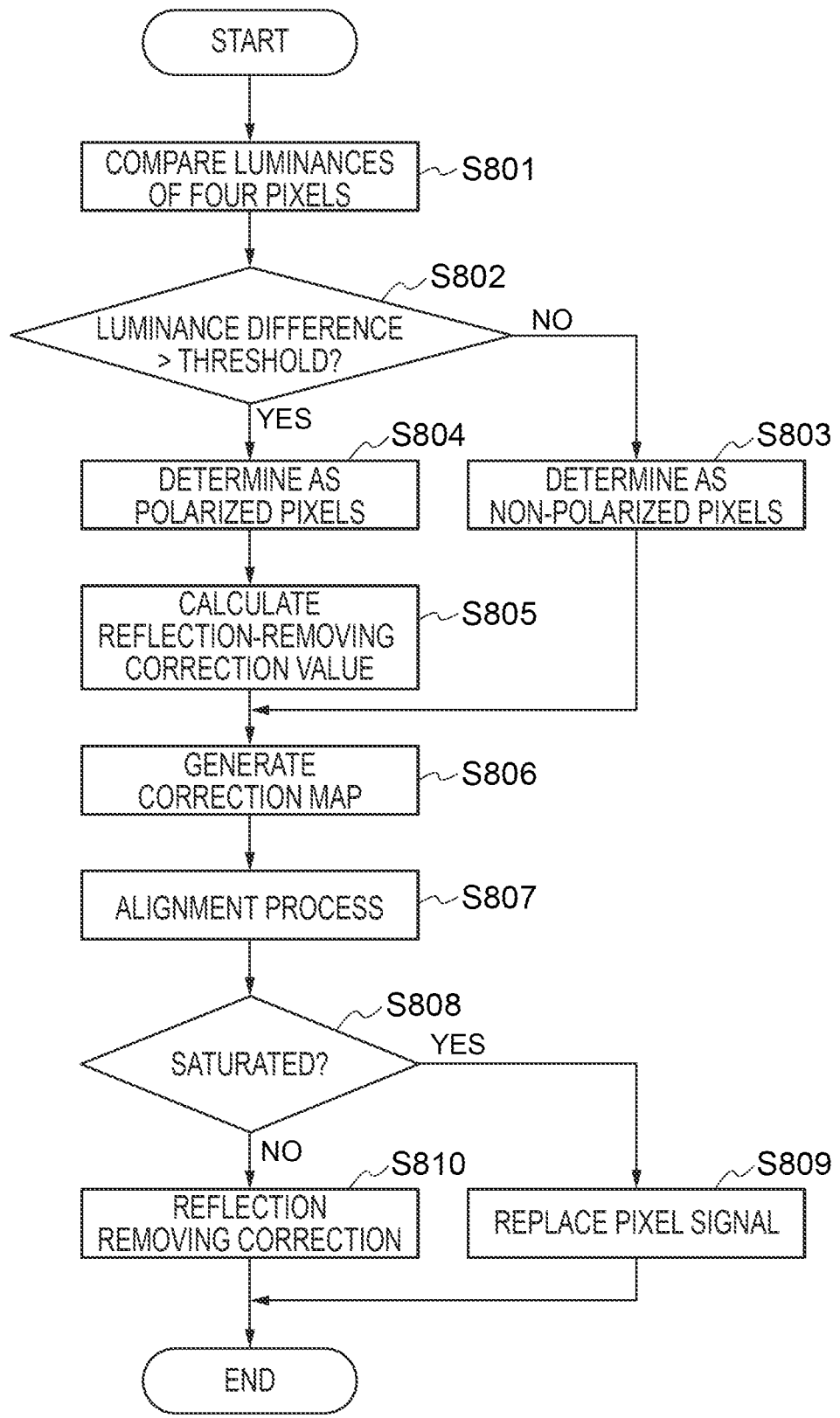
FIG. 8 is a flowchart showing a second image pickup control process of the image pickup apparatus of FIG. 1.

FIG. 8 is a flowchart showing the second image pickup control process. Each process indicated by an S-number in FIG. 8 is achieved, when the CPU 109 develops a predetermined program stored in the ROM 111 to the RAM 112 and integrally controls operations of parts of the image pickup apparatus 100.

Since the process from S801 to S807 is identical to the process from S701 to S707, its description is omitted. Next, the CPU 109 applies a saturation detection process to the signal from the second image sensor 133 and branches the process according to a detection result. That is, in S808, the CPU 109 determines whether the pixel signal of the second image sensor 133 is saturated. This is a function of a saturation detection unit. When determining that the pixel signal of the second image sensor 133 is saturated (YES in S808), the CPU 109 proceeds with the process to S809. When determining that the pixel signal of the second image sensor 133 is not saturated (NO in S808), the CPU 109 proceeds with the process to S810.

In S809, the CPU 109 replaces the saturated pixel signal of the second image sensor 133 with the corresponding pixel signal of the image-pickup-surface polarization sensor 200 and finishes this process after that. In the meantime, in S810, the CPU 109 performs the reflection removing correction that is the same as S708 and finishes this process after that.

Incidentally, the first and second image pickup control processes mentioned above may be hard to remove a reflection component correctly because of difference in resolution in a case where an object has a high frequency component. Accordingly, for example, the CPU 109 or the image processor 116 detects contrast of an object and extracts frequency components. This is a function of a frequency detection unit. When the object has a high frequency component more than a certain frequency, the above-mentioned first and second image pickup control processes are not performed. This prevents pickup of an unnatural image.

Although the present invention has been described in detail on the basis of the suitable embodiments, the present invention is not limited to these specific embodiments and includes various configurations that do not deviate from the scope of the present invention. Furthermore, the embodiments mentioned above show examples of the present invention, and it is possible to combine the embodiments suitably.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-037917, filed Mar. 5, 2020, which is hereby incorporated by reference herein in its entirety.

What is claimed is:

1. An image pickup apparatus comprising:
   a polarizing filter configured to two-dimensionally arrange a plurality of sets of polarizing filter elements, each of which includes polarizing filter elements having different polarization directions;
   a first image sensor configured to have pixels that respectively correspond to polarizing filter elements of the polarizing filter;
   a second image sensor;
   a polarization calculation unit configured to detect a polarized component of light that enters into a region in which one set of polarizing filter elements are arranged based on signals output from pixels in the region of the first image sensor; and
   a correction unit configured to correct a pixel signal output from a pixel of the second image sensor corresponding to the region based on a calculation result by the polarization calculation unit for each pixel of the second image sensor,
   wherein the correction unit is configured to correct a luminance value obtained from the second image sensor by multiplying a value that is obtained by dividing a luminance value of a non-polarized component obtained from the first image sensor by a luminance value obtained from the first image sensor in a case where a phase of the polarized component is zero by the luminance value obtained from the second image sensor for each pixel of the second image sensor.

2. The image pickup apparatus according to claim 1, wherein one set of the polarizing filter elements is arranged so as to change the polarization directions mutually, and
   wherein the correction unit is configured to correct a pixel signal output from a pixel of the second image sensor corresponding to the region using the signals output from pixels in the region of the first image sensor in a case where the polarized component is larger than a predetermined threshold.

3. The image pickup apparatus according to claim 1, further comprising a saturation detection unit configured to detect whether a pixel signal output from the second image sensor is saturated for each pixel, and
   wherein the correction unit is configured to replace the saturated pixel signal with a signal of a corresponding pixel of the first image sensor in a case where the saturation detection unit detects that the pixel signal from the second image sensor is saturated.

4. The image pickup apparatus according to claim 1, further comprising a frequency detection unit configured to detect a frequency component of an object, and
wherein the correction unit is configured to not correct pixel signals output from the second image sensor in a case where the frequency detection unit detects that the object has a high frequency component more than a certain frequency.

5. The image pickup apparatus according to claim 1, wherein the set of polarizing filter elements include at least three polarizing filter elements whose polarization directions are mutually different.

6. The image pickup apparatus according to claim 1, further comprising:
a first optical system configured to guide light from an object to the first image sensor;
a second optical system configured to guide light from the object to the second image sensor; and
an alignment unit configured to correct pixel signals obtained from at least one of the first and second image sensors so as to eliminate deviation between a position of an object image obtained from the first image sensor and a position of an object image obtained from the second image sensor.

7. The image pickup apparatus according to claim 1, wherein a color filter that is configured by arranging red filter elements, green filter elements, and blue filter element in a Bayer arrangement is provided to each of the first and second image sensors.

8. The image pickup apparatus according to claim 1, wherein a pixel size of the second image sensor is identical to a size of a region corresponding to the set of polarizing filter elements of the first image sensor.

9. A control method for an image pickup apparatus including a polarizing filter that two-dimensionally arranges a plurality of sets of polarizing filter elements, each of which includes polarizing filter elements having different polarization directions, a first image sensor that has pixels that respectively correspond to polarizing filter elements of the polarizing filter, and a second image sensor, the control method comprising:
detecting a polarized component of light that enters into a region in which one set of polarizing filter elements are arranged based on signals output from pixels in the region of the first image sensor;
determining whether the polarized component is larger than a predetermined threshold;
correcting a pixel signal of a pixel of the second image sensor corresponding to the region based on signals output from pixels in the region of the first image sensor in a case where the polarized component is larger than the predetermined threshold, the correcting including correcting a luminance value obtained from the second image sensor by multiplying a value that is obtained by dividing a luminance value of a non-polarized component obtained from the first image sensor by a luminance value obtained from the first image sensor in a case where a phase of the polarized component is zero by the luminance value obtained from the second image sensor for each pixel of the second image sensor; and
generating a pickup image using pixel signals of the second image sensor corresponding to regions where polarized components are not larger than the predetermined threshold and signals that are corrected.

* * * * *